United States Patent [19]

Ohara et al.

[11] Patent Number: 5,470,618
[45] Date of Patent: Nov. 28, 1995

[54] METHOD OF MAKING ZINC-BASED TRANSPARENT CONDUCTIVE FILM

[75] Inventors: Fumio Ohara, Nukata; Tadashi Hattori, Okazaki; Nobuei Ito, Okazaki; Yutaka Hattori, Okazaki; Masumi Arai, Okazaki, all of Japan

[73] Assignee: Nippon Soken, Inc., Japan

[21] Appl. No.: 274,149

[22] Filed: Jul. 14, 1994

Related U.S. Application Data

[63] Continuation of Ser. No. 908,917, Jul. 2, 1992, abandoned, which is a continuation of Ser. No. 729,882, Jul. 11, 1991, abandoned, which is a division of Ser. No. 410,631, Sep. 21, 1989, abandoned.

[30] Foreign Application Priority Data

Sep. 22, 1988 [JP] Japan .................................. 63-238343
Jun. 29, 1989 [JP] Japan .................................. 1-167276

[51] Int. Cl.⁶ .................................................. C23C 14/08
[52] U.S. Cl. ............................................. 427/529; 427/523
[58] Field of Search ...................................... 427/523, 524, 427/529, 530; 204/298.05

[56] References Cited

U.S. PATENT DOCUMENTS

| 4,336,120 | 6/1982 | Sakakura et al. | 204/192.18 |
| 4,526,802 | 7/1985 | Sato | 204/192.31 X |

FOREIGN PATENT DOCUMENTS

| 54-42696 | 4/1979 | Japan . | |
| 56-18672 | 4/1981 | Japan . | |
| 357027982 | 2/1982 | Japan | 427/529 |
| 61-96609 | 5/1986 | Japan . | |
| 2297462 | 12/1987 | Japan | 204/192.31 |
| 363089656 | 4/1988 | Japan | 427/529 |

OTHER PUBLICATIONS

T. Minami et al.: "Highly Conductive and Transparent Aluminum Doped Znic Oxide Thin Films Prepared by RF Magnetron Sputtering", Japanese Journal of Applied Physics, vol. 23, No. 5, May, 1984, pp. L280–L282.

T. Minami et al.: "Group III Impurity Doped Zinc Oxide Thin Films Prepared by RF Magnetron Sputtering", Japanese Journal of Applied Physics, vol. 24, No. 10, Oct., 1985, pp. L781–L784.

S. Shooji et al.: "Highly Conductive and Transparent Zinc Oxide Films Prepared by RF Magnetron Sputtering", Tsushin Gakkai Kenkyukai CPM84–8, pp. 55–62 [Partial Translation attached].

M. Machida et al.: "ZnO Piezoelectric Films Formed by RF Reactive Ion–Plating", Denshi Tsushin Gakkai-shi, vol. J62-C, No. 6, '79-5, pp. 358–364 [Partial Translation attached].

Qui, et al., "Air Heat Treatment of In–DOPED ZnO Thin Films", Solar Energy Materials 25 (1987), pp. 261–267.

*Primary Examiner*—Nam Nguyen
*Attorney, Agent, or Firm*—Cushman Darby & Cushman

[57] ABSTRACT

A zinc oxide-based transparent conductive film containing of gallium or indium and having a resistivity of not more than $10^{-3}$ Ω.cm is provided by evaporating a source of zinc oxide containing 0.5 to 5% by weight of gallium oxide or 0.3 to 4.5% by weight of indium oxide and depositing same onto a substrate after activating the vapor of the source by a plasma.

7 Claims, 6 Drawing Sheets

METHOD OF MAKING ZINC-BASED TRANSPARENT CONDUCTIVE FILM

This is a Rule 62 continuation of application Ser. No. 07/908,917, filed on Jul. 2, 1992, now abandoned, which is a Rule 62 Cont. of Ser. No. 07/729,882 filed Jul. 11, 1991, now abandoned, which is a Rule 62 Divisional application of Ser. No. 07/410,631 filed Sep. 21, 1989, now abandoned.

BACKGROUND OF THE INVENTION

1. Field of the Invention

The present invention relates to a zinc oxide-based transparent conductive film and a process for forming such a film. The zinc oxide-based film is a $Ga_2O_3$ or $In_2O_3$-doped zinc oxide film having an improved conductivity.

2. Description of the Related Art

As a transparent conductive film, an ITO (Indium Tin Oxide) film is used for transparent electrodes in solar cells and electroluminescence display devices, etc. An alternative transparent conductive film of zinc oxide (ZnO)-based is also known, which material is cheap and widely available. Recently, aluminum has been added to a ZnO-based transparent conductive film to improve the resistivity of the film, and a radio frequency sputtering is usually used for forming such a ZnO-based transparent conductive film, including an Al-doped film. Nevertheless, in the above method, the substrate must be arranged perpendicular to or inclined by 45° to the target, and the film must be about 300 nm thick to obtain a ZnO-based transparent conductive film having a resistivity as low as that of ITO. Accordingly, it is very difficult to obtain such a film uniformly over a large area.

SUMMARY OF THE INVENTION

Therefore, the object of the present invention is to obtain a ZnO-based transparent conductive film having a low resistivity over a large area.

To obtain the above object, according to the present invention, there is provided a zinc oxide-based transparent conductive film containing 0.4 to 8 atom % of gallium and having a resistivity of not more than $10^{-3}$ $\Omega$.cm.

Further, according to the present invention, there is provided a process for forming such a zinc oxide-based transparent conductive film, comprising the steps of arranging a substrate on which the gallium doped-zinc oxide film is to be deposited, and an evaporation source of zinc oxide containing 0.5 to 5.0 wt % of gallium oxide, in a vacuum chamber, evacuating the vacuum chamber, heating the source to evaporate vapor of the source, activating the vapor of the source by a plasma, and depositing the activated vapor of the source onto the substrate to form a gallium-doped zinc oxide film.

The gallium or gallium oxide can be replaced by indium or indium oxide.

To solve the problem of the prior art and to obtain the above object of the present invention, instead of the radio frequency sputtering, the inventors have utilized a radio frequency ion plating for obtaining a large area uniform aluminum-doped zinc oxide transparent conductive film. In the radio frequency ion plating, aluminum oxide was first contained in an evaporation source of a sintered pellet of zinc oxide, but it was difficult to thereby stably obtain an aluminum-doped zinc oxide transparent conductive film having a low resistivity. The reason for this difficulty was a large difference of the vapor pressure between ZnO and $Al_2O_3$, which made it difficult to deposit an aluminum-doped zinc oxide film with a uniform aluminum doping rate. The present inventors then replaced the evaporation source of sintered pellets of zinc oxide to which aluminum oxide was added with sintered pellets of zinc oxide to which gallium or indium oxide was added and thereby successfully created the present invention.

Although an addition of gallium or indium to a zinc oxide-based transparent conductive film has been mentioned in various reports (Japanese Journal of Applied Physics, vol. 24, No. 10, October 1985, pp. L781–784, etc.), a radio frequency sputtering was used as the method of forming the film, and as a result, not only did the problem of a difficulty of obtaining a large area thin film with a good quality arise but also the resistivity of the obtained film was relatively high at $8.0 \times 10^{-4}$ $\Omega$.cm. The present invention is basically different from this prior art in that a radio frequency ion plating or other equivalent methods are utilized instead of the radio frequency sputtering, and by a lower resistivity, etc. of the film. It has also been reported that ion plating was used for obtaining a zinc oxide film (M. Machida et al, "ZnO piezoelectric Films Formed by RF Reactive Ion-Plating", Japanese Denshi Tsushin Gakkai-shi, vol. J62-C, No. 6, May 1979, pp. 358–364), but this film is a highly resistive piezoelectric film, different from the transparent conductive film of the present invention, and does not contain gallium, indium or aluminum. Therefore, it is not easy to apply ion plating to the formation of a doped zinc oxide transparent conductive film.

DESCRIPTION OF THE PREFERRED EMBODIMENTS

The present invention is further described with reference to the following examples.

Example 1

Figure 1:
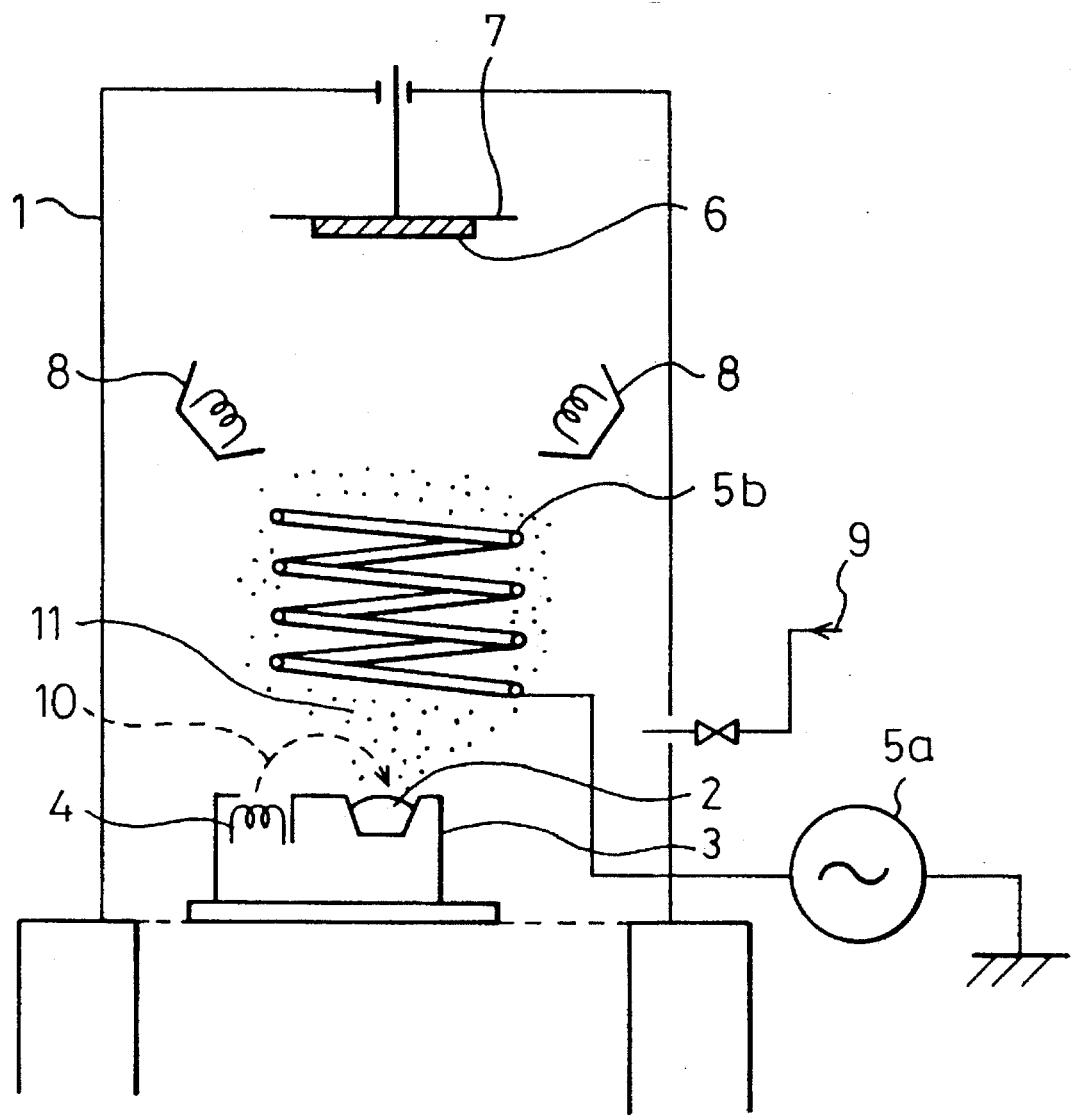
FIG. 1 is a schematic view of a radio frequency ion plating unit.

In FIG. 1, 1 denotes a vacuum chamber in which a copper crucible 3 for containing evaporation pellets 2 and an electron beam generator 4 for heating the evaporation pellets 2 are arranged.

The evaporation pellets 2 were prepared by adding 2.6 wt % of $Ga_2O_3$ powders to ZnO powders and uniformly mixing the powder mixture with a kneader or a ball mill, etc., followed by pressing into a desired shape at a pressure of about 700 kg/cm$^2$. The obtained shape was then baked in air at about 1000° C. for 2 hours. The resultant baked pellets to be used for evaporation had a density of 4.5 g/cm$^3$.

A radio frequency coil 5b causing a radio frequency discharge by a radio frequency power 5a, and a substrate 6 and a substrate holder 7 were arranged above the evaporation pellets 2, in the vacuum chamber 1. The substrate 6, held by the holder 7 faced the evaporation pellets 2, and heater 8 was arranged near the substrate 6, for heating the substrate 6. The vacuum chamber 1 had a gas inlet port 9 for introducing a gas for the radio frequency discharge.

The operation of the radio frequency ion plating unit was carried out in the following manner. The evaporation pellets 2 prepared as described above were charged in the copper crucible 3, and argon gas was introduced from the gas inlet port 9 into the vacuum chamber 1, and the chamber 1 was evacuated to 6.6×10$^{-3}$ Pa. Then a radio frequency power was supplied to the radio frequency coil 5b to cause a radio frequency discharge, and the pressure in the vacuum chamber 1 was adjusted to about 0.04 Pa. The evaporation pellets 2 were heated by the electron beam 10 generated by the electron beam generator 4 to produce vapor or evaporated particles 11. As the evaporated particles 11 rose, the energy and activity of the evaporated particles 11 were controlled by the radio frequency discharge excited by the radio frequency power of 70 W. Accordingly, a zinc oxide-based transparent conductive film having an adequate oxygen deficiency was deposited onto the substrate 6, which has been heated to about 100° C., at a deposition rate of −1.0 to 2.0 Å sec.

The thus-obtained Ga-doped ZnO-based transparent conductive film having a thickness of 200 nm had visible light transmittance of 80 to 90%, and thus was an excellent transparent film showing substantially no absorption of the light. Further, the obtained resistivity of the film was as low as that of ITO and the resistivity was not increased even if the thickness of the film was reduced to 100 nm, Further, the crystallinity of the thus-obtained Ga-doped ZnO-based transparent conductive film was analyzed by X-ray diffraction, and it was found that the film had a good crystallinity in which the crystals were properly oriented in the direction of the C-axis, and had a satisfactory carrier density of about 10$^{21}$/cm$^3$, and thus the film had an excellent thermal stability.

Figure 2:
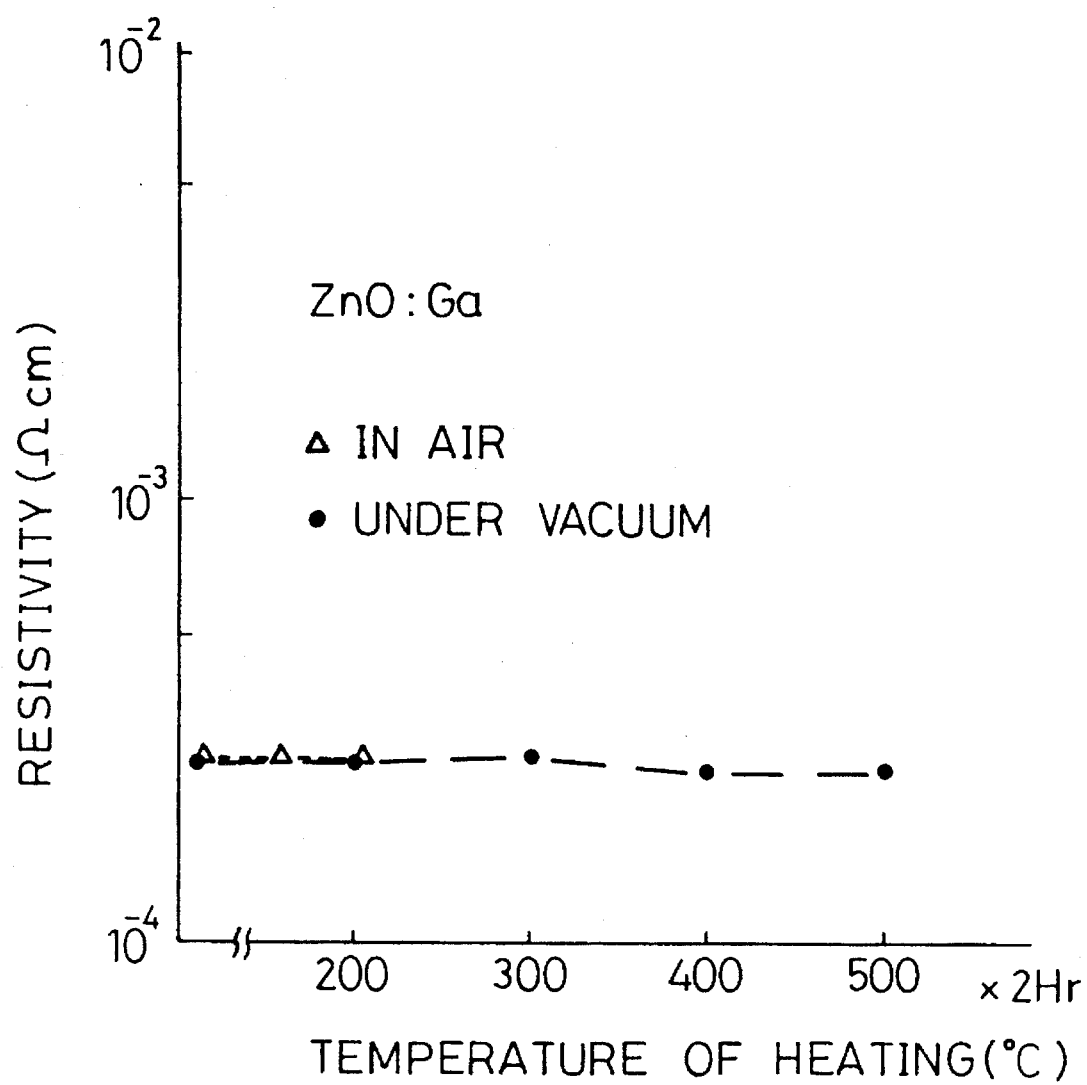
FIG. 2 shows the relationship between the resistivity of the gallium oxide-doped zinc oxide film and the temperature at which the film is heat-treated.

FIG. 2 shows the resistivity of the above-obtained ZnO-based transparent conductive film after heat-treating the film in air and under a vacuum. As clear from FIG. 2, the above-obtained ZnO-based transparent conductive film had an excellent thermal stability of low resistivity . This is because the film had an excellent crystallinity and a satisfactory carrier concentration due to the gallium donor, and therefore, the resistivity was not changed even if the oxygen deficiency was lowered by the heat treatment.

Comparative Example 1

Figure 3:
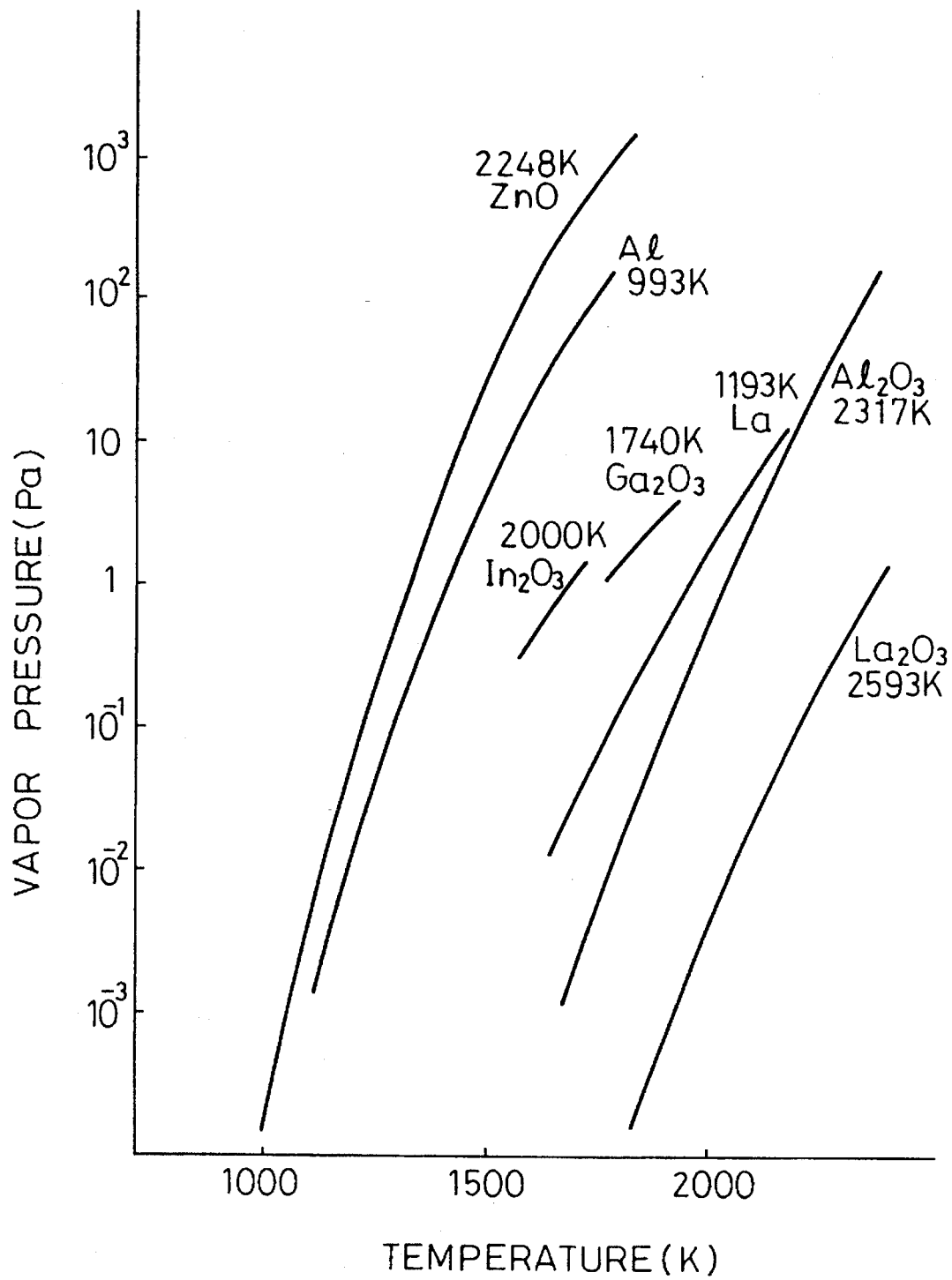
FIG. 3 shows the vapor pressure of elements and oxides thereof.

The present inventors considered that elements having a low first ionization energy would be effective as a donor for reducing the resistivity of a ZnO-based transparent conductive film, lanthalum (La), indium (In) and aluminum (Al), in addition to gallium (Ga), can be mentioned as such elements. FIG. 3 shows the vapor pressures and the melting points of In, La, and Al, and the oxides thereof. The temperatures shown near the notations of the elements and the oxides are the melting points thereof. The vapor pressure and the melting point of Ca$_2$O$_3$ are also shown in FIG. 3.

Considering the relationship between the vapor pressure and the melting point of the elements and oxides with those of ZnO, the procedures of Example 1 were repeated and In$_2$O$_3$, La$_2$O$_3$ and Al$_2$O$_3$, instead of Ga$_2$O$_3$, were used to form a zinc oxide-based transparent conductive film. These experiments showed that, as the vapor pressure and the melting point of the additive became more different than those of ZnO, it was more difficult to stably and reproducibly form the film containing that additive. Particularly, when La$_2$O$_3$ was used instead of Ga$_2$O$_3$, the ZnO-based film could not effectively contain the La$_2$O$_3$, even if 50% by weight or more of La$_2$O$_3$ was contained in the evaporation pellets. Namely, La$_2$O$_3$ was not satisfactory as the additive.

The metals Al and La were also used, but when the evaporation pellets were heated by the electron beam, bumping occurred and the deposition was unstable.

When Al$_2$O$_3$ was used, it was easier to contain the donor in the deposited film than when La$_2$O$_3$ was used, but it was more difficult to contain the donor in the deposited film and to obtain a lowered resistivity of the film than when Ga$_2$O$_3$ was used.

When In$_2$O$_3$ was used, a lowered resistivity of the deposited film was obtained, similar to that obtained by Ga$_2$O$_3$.

Example 2

The procedures of Example 1 were repeated except that the content of Ga$_2$O$_3$ in the evaporation pellets was varied. The radio frequency power was 70 W and the temperature of the substrate was 100° C.

Figure 4:
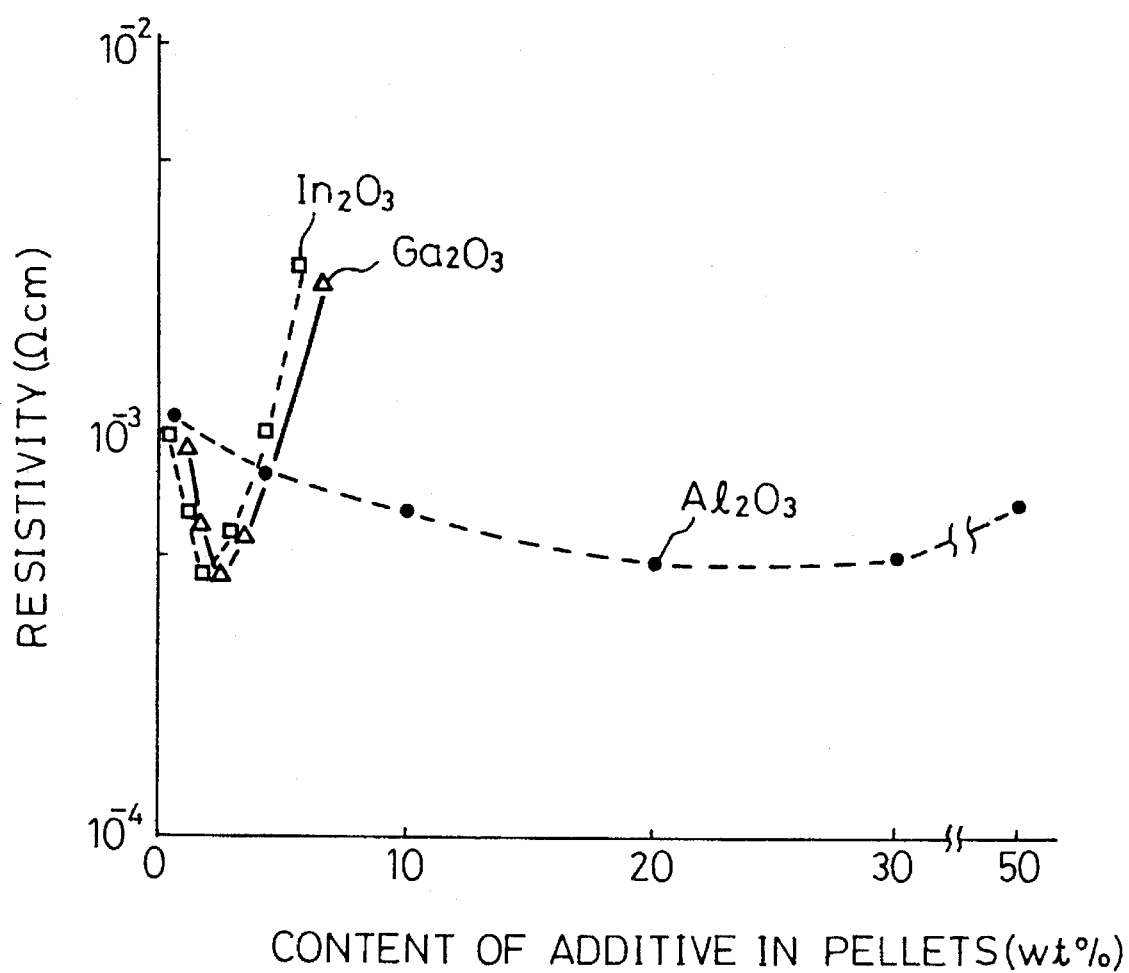
FIG. 4 shows the relationship between the resistivity of the deposited film and the content of the additive in the pellets.

FIG. 4 shows the results of the above procedures, i.e., the relationship between the resistivity of the resultant ZnO-based transparent conductive film and the content of the Ga$_2$O$_3$ in the evaporation pellets. From FIG. 4, it is seen that a low resistivity of the film, over a large area, of not more than 10$^{-3}$ Ω.cm can be stably obtained when the content of the Ga$_2$O$_3$ in the evaporation pellets is 0.5 to 5.0 wt %, preferably 2 to 3 wt % by weight.

Example 3

The procedures of Example 1 were repeated except that the Ga$_2$O$_3$ was replaced by In$_2$O$_3$ and the content of the In$_2$O$_3$ in the evaporation pellets was varied.

The results of the above procedures, i.e., the relationship between the resistivity of the resultant ZnO-based transparent conductive film and the content of the In$_2$O$_3$ in the evaporation pellets are also shown in FIG. 4.

FIG. 4 shows that the content of 0.3 to 4.5 wt %, preferably 1.5 to 2.5 wt %, of the In$_2$O$_3$ in the evaporation pellets provides a lower resistivity of the ZnO-based transparent conductive film, compared to that obtained by Ga$_2$O$_3$.

Comparable example 2

The procedures of Example 1 were repeated except that the Ga$_2$O$_3$ was replaced by Al$_2$O$_3$ and the content of the Al$_2$O$_3$ in the evaporation pellets was varied.

The results of the above procedures, i.e., the relationship between the resistivity of the resultant ZnO-based transparent conductive film and the content of the Al$_2$O$_3$ in the evaporation pellets are also shown in FIG. 4.

When Al$_2$O$_3$ was used, a low resistivity of the ZnO-based transparent conductive film was obtained at a content of the Al$_2$O$_3$ in the evaporation pellets in a range of 20 to 30 wt %, but it was difficult to evaporate $Al_2O_3$ in comparison with $Ga_2O_3$, and therefore, difficult to stably form a large area $Al_2O_3$-doped ZnO-based film.

Example 4

The procedures of Example 1 were repeated except that the content of the $Ga_2O_3$ in the evaporation pellets was varied. For this example, the relationship between the resistivity of the resultant ZnO-based transparent conductive film and the content of the Ga in the ZnO-based film was examined. The results are shown in FIG. 5.

Figure 5:
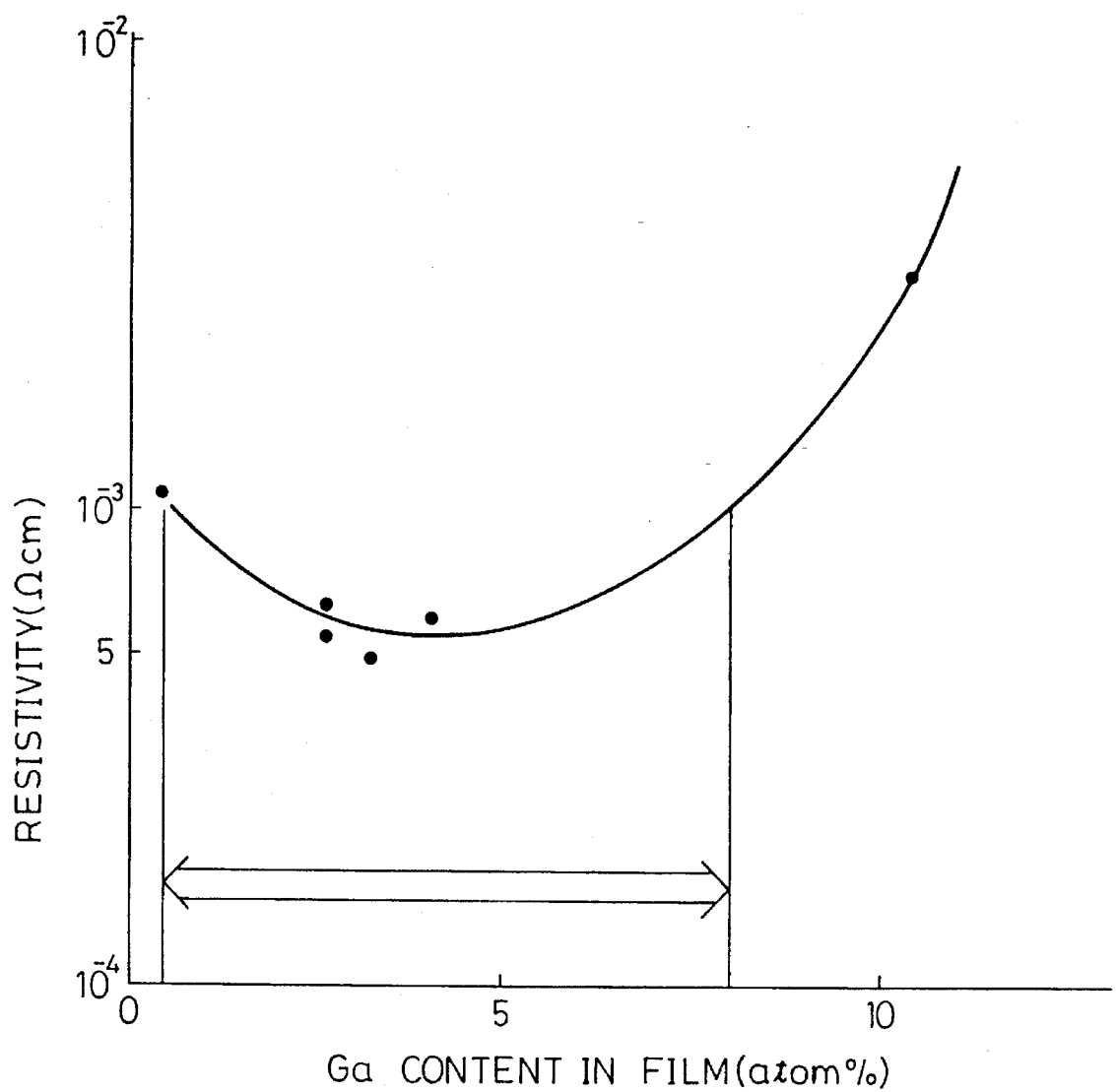
FIG. 5 shows the relationship between the resistivity and the content of the gallium in the deposited film.

From FIG. 5, it is seen that a low resistivity of the film of not more than $10^{-3}$ Ω.cm over a large area can be stably obtained when the content of the Ga in the ZnO-based transparent conductive film is 0.4 to 8% atom %, preferably 2 to 4 atm %.

Example 5

The procedures of Example 1 were repeated except that the temperature of the substrate was varied within a range of 90° to 260° C., while keeping the content of the $Ga_2O_3$ in the evaporation pellets at 2.6 wt % and the radio frequency power at 70 W.

Figure 6:
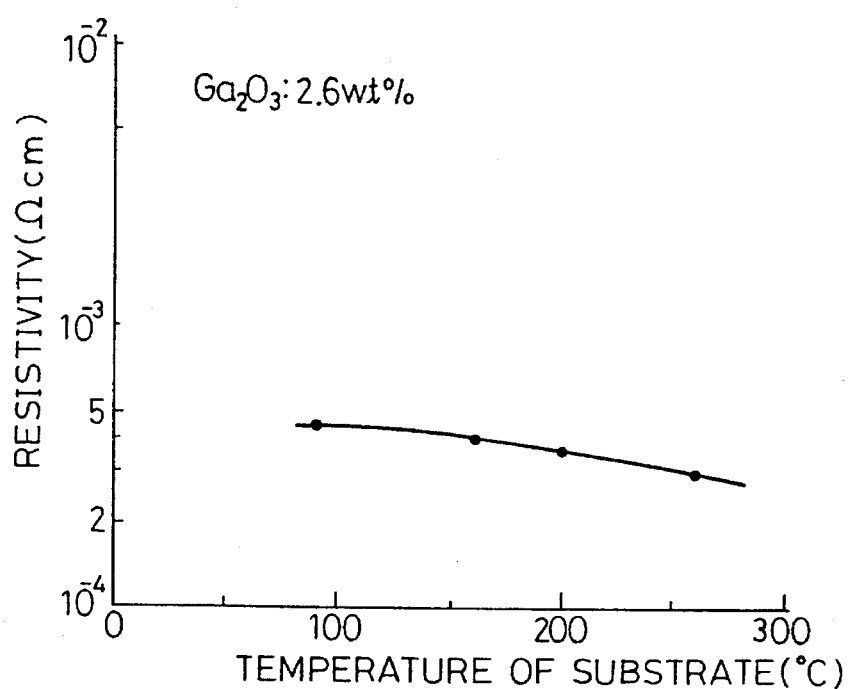
FIG. 6 shows the relationship between the resistivity of the deposited film and the temperature of the substrate during the deposition.

FIG. 6 shows the relationship between the resistivity of the resultant film and the temperature of the substrate. As seen from FIG. 6, a ZnO-based transparent conductive film having a lower resistivity was obtained when the temperature of the substrate was elevated during the deposition (particularly to 250° C. or more). When the substrate was not heated during the deposition, the resultant deposited film had a lowered light transmittance and an increased resistivity. Therefore, preferably the substrate is heated to at least 50° C.

Example 6

The procedures of Example 1 were repeated except that the radio frequency power was varied within a range of 120 to 20 W while keeping the content of the $Ga_2O_3$ in the evaporation pellets at 2.6 wt % and the temperature of the substrate at 260° C.

Figure 7:
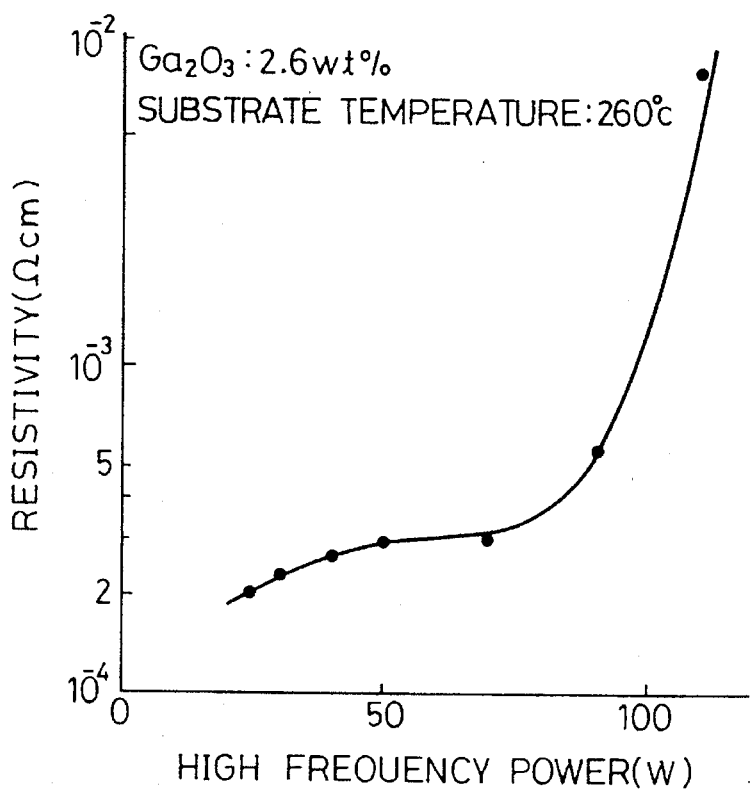
FIG. 7 shows the relationship between the resistivity of the deposited film and the radio frequency power used for the deposition.

FIG. 7 shows the relationship between the resistivity of the resultant film and the radio frequency power. As seen from FIG. 7, a ZnO-based transparent conductive film having a lower resistivity was obtained when the radio frequency power was lowered (particularly, to 30 W or less), and a resistivity of not more than $10^{-3}$ Ω.cm was obtained when the radio frequency power was about 100 W or less. When the radio frequency power was not applied during the deposition, the resultant deposited film had a lowered light transmittance and an increased resistivity. Therefore, preferably a radio frequency power of 20 W or more is applied.

In the above Examples, a radio frequency ion plating was used, but other similar ion processes or evaporation processes may be adopted to obtain a ZnO-based transparent conductive film having a low resistivity. Further, instead of heating the evaporation pellet by an electron beam, an electric heater or similar device may be used. Further, instead of argon gas, neon, helium, krypton, or a mixture thereof may be used. Oxygen may be mixed with these inert gases, depending on the method and conditions of the deposition.

We claim:

1. A process for forming a zinc oxide-based transparent conductive film, comprising the steps of:

arranging a substrate on which the zinc oxide-based film is to be deposited, and an evaporation source substantially composed of zinc oxide containing one of indium oxide and gallium oxide in a vacuum chamber;

evacuating the vacuum chamber;

evaporating the source to produce evaporated particles;

activating the evaporated particles by a plasma excited by a radio frequency power in the range of 20 W to 100 W; and depositing by ion plating the activated evaporated particles onto the substrate by heating the substrate to at least 50° C. to form a transparent zinc oxide-based film doped with one of indium and gallium, the resistivity of which is controlled to be not more than $5\times10^{-4}$ Ω.cm by the radio frequency power.

2. A process according to claim 1, wherein the source contains 2 to 3 wt % of gallium oxide.

3. A process according to claim 2, wherein said evaporation source is a pellet composed substantially of zinc oxide and gallium oxide having a density of about 4.5 g/cm3.

4. A process according to claim 1, wherein the source contains 1.5 to 2.5 wt. % of indium oxide.

5. A process according to claim 1, wherein the activated evaporated particles are deposited onto the substrate at a rate of between 1.0 to 2.0 Å/sec.

6. A process according to claim 1, wherein the temperature of the substrate is between 90° C. and 260° C.

7. A process according to claim 1, wherein the atmosphere in the vacuum chamber during the deposition of the activated evaporated particles onto the substrate is argon atmosphere.

* * * * *